United States Patent [19]

Kraft et al.

[11] Patent Number: 4,728,850
[45] Date of Patent: Mar. 1, 1988

[54] MOUNTING MEANS FOR MOUNTING SPIRAL WIRE CATHODES

[75] Inventors: Reinhardt Kraft, Altenstadt; Horst Ranke, Alzenau, both of Fed. Rep. of Germany

[73] Assignee: Leybold-Heraeus GmbH, Cologne, Fed. Rep. of Germany

[21] Appl. No.: 881,635

[22] Filed: Jul. 3, 1986

[30] Foreign Application Priority Data

Sep. 30, 1985 [DE] Fed. Rep. of Germany ....... 3534793

[51] Int. Cl.⁴ .......................... H01J 37/65; H01J 1/18
[52] U.S. Cl. ..................................... 313/278; 313/270; 313/286; 313/290; 313/337; 313/344; 219/121 ET; 219/542
[58] Field of Search ............... 313/337, 237, 238, 270, 313/271, 278, 285, 286, 344, 305; 219/121 EB, 121 ET, 542

[56] References Cited

U.S. PATENT DOCUMENTS 4,084,077 4/1978 Porazhinsky ................ 219/121 EB

Primary Examiner—David K. Moore
Assistant Examiner—Mark R. Powell
Attorney, Agent, or Firm—Felfe & Lynch

[57] ABSTRACT

In a mounting device for electrically heated, spirally wound wire cathodes in electron guns, two mounting posts joined together by an insulator are configured as sector-shaped sections of a hollow cylinder, and have each a circumferential groove on its end remote from the insulator. The surfaces defining the grooves are parts of common circular and cylindrical surfaces, and the mounting ends of the cathodes are of a configuration approximately complementary to that of the grooves in the mounting posts. The mounting ends therefore lie in a spring-biased and form-fitting manner in the circumferential grooves.

6 Claims, 6 Drawing Figures

MOUNTING MEANS FOR MOUNTING SPIRAL WIRE CATHODES

BACKGROUND OF THE INVENTION

The invention relates to a means for mounting spirally wound heatable cathodes in electron guns having two holding posts joined together by an insulator.

Electron guns of this kind are used as sources of high-powered electron beams of the kind used for melting and/or evaporating materials in a vacuum. The block cathode, consisting essentially of a massive circular disk, is generally heated by electron bombardment from a directly heated, spirally bent cathode consisting of wire, and then, on the basis of an accelerating voltage present in the system, emits a beam of electrons.

In a known mounting means of the kind described above, the two ends of the wire cathode are aligned parallel with the axis of the entire gun system and held in cylindrical pieces made of tantalum, which for the purpose of the necessary adjustment of the cathode have excentric bores for the cathode ends. The cylindrical pieces are in turn clamped by cap nuts made of graphite against hollow metal terminal screws which in turn are joined to a common insulator. Each of the assemblies consisting of the cylindrical pieces, the cap nuts and the hollow terminal screws constitutes a so-called support post.

In the known system it is found to be disadvantageous that the excentric adjustment of the terminal ends of the wire cathode does not allow a definite installed position, whether in regard to height adjustment nor in regard to centering. Installation is difficult, and contact problems are encountered, which result in a frequent replacement of the cathodes due to oxidation in the area of the support post, especially the graphite cap nuts. Also, due to the great length of the terminal ends of the cathode, a thermal distortion of the cathode is unavoidable, destroying an adjustment achieved with great effort. After the wire cathode has been heated for the first time, however, straightening it by bending is no longer possible, since the brittle cathode material (tungsten) no longer permits further bending.

The invention is addressed to the problem of improving a mounting means for wire cathodes such that the spirally wound portion of these cathodes will be given an extremely precise position with respect to the beam-forming parts disposed around it, both with regard to its installed height and with regard to its centering. In addition, a perfect, long-lasting transfer of the relatively high heating current is to be possible (low contact resistance).

THE INVENTION

The solution of the stated problem is accomplished according to the invention, in the mounting means described above, in that the posts are sector-shaped sections from a metal hollow cylinder and have on their ends remote from the insulator a circumferential groove, the surfaces defining the grooves being parts of common circular and cylindrical surfaces, and also in that the ends of the cathode are configured to be approximately complementary to the grooves in the supporting posts, such that these ends lie in the circumferential grooves in a spring-biased and form-fitting manner.

The shape of the cathode can also be expressed by stating that their terminal ends are bent away in a plane radial to the cathode axis and are curved in an approximately circular manner in this plane, the radius of curvature increasing toward the ends.

In the manner described, two planes parallel to one another are defined, namely a first plane in which the spirally wound portion of the cathode lies, and a second plane in which the circularly bent terminal ends of the cathode lie. The two planes have a precisely defined distance apart and are also disposed precisely perpendicular to the system axis of the electron or ion gun. The connection between the terminal ends and the spirally wound portion is then provided only by diagonally disposed sections of the wire which merge directly with the spirally wound portion. By this measure it is made possible to achieve not only a precise installed height, but also an absolutely precise centering of the central point of the spirally wound portion. The length of the terminal ends is reduced to a minimum, and the good contact provided under spring bias in the circumferential grooves results also in relatively low contact resistances, giving the wire cathode a long useful life. The expensive cylindrical posts made of tantalum, as well as the likewise expensive graphite cap nuts, are eliminated. In this manner, too, any later thermal distortion of the entire cathode is also eliminated to an extraordinary extent. Moreover, a rapid change of the cathode is made possible.

An embodiment of the invention will now be further explained in conjunction with FIGS. 1 to 6.

DESCRIPTION OF A PREFERRED EMBODIMENT

Figure 1:
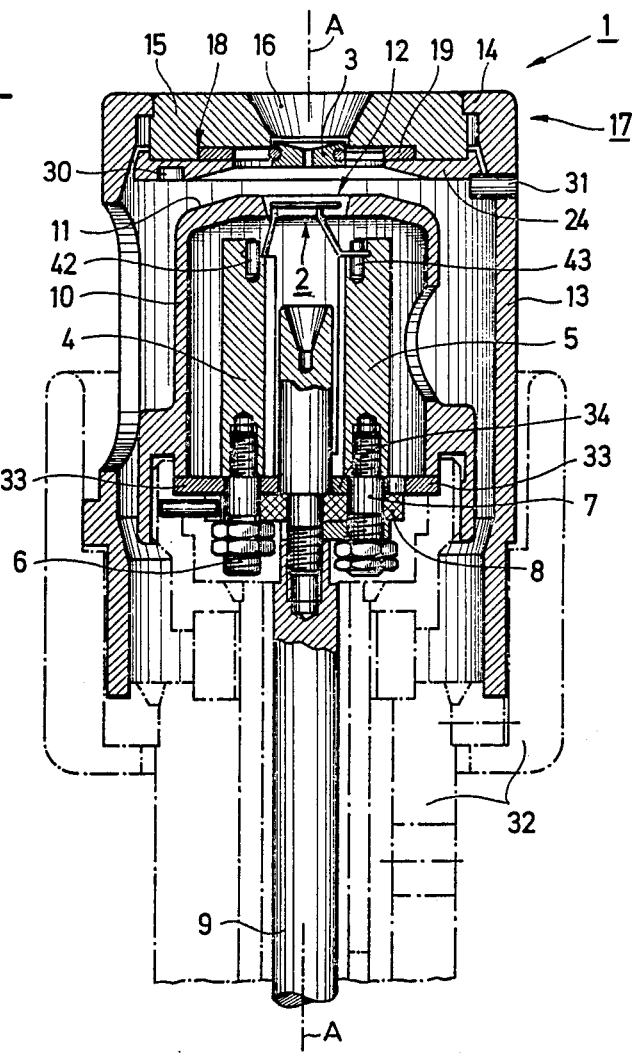
FIG. 1 is an axial cross section through a complete electron gun.

In FIG. 1 there is shown an electron gun 1 which has a directly heated first cathode 2 and a second cathode 3, the so-called block cathode, which is indirectly heated by the first cathode. The first cathode 2 consists in its central portion of a spirally wound wire which is joined by two terminal ends leading rearwardly and outwardly to metal posts 4 and 5 which simultaneously serve to deliver the electric current. The posts 4 and 5 are held by means of two terminal screws 6 and 7 on an insulating body 8 which in turn is fastened to a supporting rod 9 which simultaneously serves to carry current to the right-hand terminal screw. The power supply to terminal screw 6 is not shown in detail. The arrangement described above is housed in an inner focusing electrode 10 which has in its front end 11 a coaxial bore 12 in which the first cathode 2 is disposed. Thus a beam is produced which is directed upwardly in operation (with reference to FIG. 1), and which strikes the block cathode 3 and causes a more or less strong heating of the block cathode, depending on the established potential, so that the cathode in turn emits an upwardly directed beam.

The inner focusing electrode 10 is concentrically surrounded by a hollow cylinder 13 having an end flange 14. Into the circular opening thus formed, a disk-shaped piece 15 is inserted such that its central bore 16 is concentric with the common axis A—A of the entire system. The disk-shaped piece 15 thrusts against a shoulder surface, not specifically indicated, on the end flange 14. The hollow cylinder 13 and the disk-shaped piece 15 together form an outer focusing electrode 17.

In the disk-shaped piece 15 there is a first centering surface 18 concentric with the bore 16, and it is in the form of a narrow cylindrical surface. The cylindrical recess defined by the centering surface 18 serves to accommodate an assembly with the block cathode 3 and a holding ring 19 for the block cathode. This holding ring has a second centering surface complementary to the first centering surface 18, but not further identified. Of course, a sufficiently great space is present between the block cathode 3 and the inside diameter of the holding ring.

The holding ring 19 is held in the disk-shaped piece 15 by a locking ring 24 whose inside diameter corresponds substantially to the inside diameter of the holding ring 19.

On its outer circumference, the locking ring 24 has two radial grooves which extend over the entire thickness of the locking ring. From these grooves begin two ramps running circumferentially, whose terminal edges lie in the bottom defining surface of the locking ring 24. Furthermore, two bores 30 are present, which serve for engagement by a tool for the purpose of turning the locking ring 24.

To fix the locking ring, whose outside diameter corresponds approximately to the inside diameter of the hollow cylinder 13, two cylindrical pins 31 are disposed at diametrically opposite points, of which only one is shown. On the basis of the grooves present in the locking ring 24, the latter can be brought between the cylindrical pin 31 and the disk-shaped piece 15. By turning the locking ring 24, the above-mentioned ramps slide over the cylindrical pins 31, so that the locking ring 24 is tightened against the cylindrical pins 31 on the one hand and against the disk-shaped piece 15 on the other. The piece 15 is thus in turn pressed against the end flange 14. The parts forming the gun are fastened in a mount 32, which is indicated only by broken lines since it is not a part of the invention.

Figure 2:
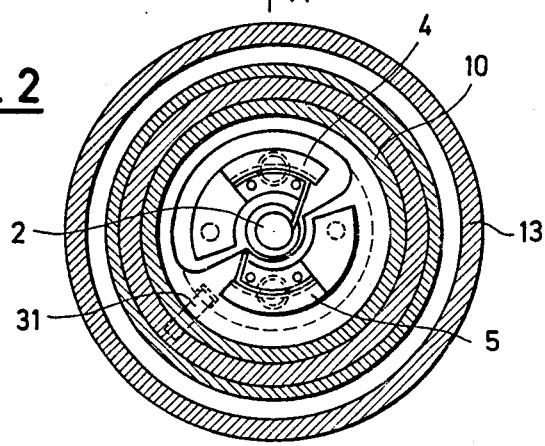
FIG. 2 is a top view of the subject of FIG. 1 open at the top so that the filament holder can be seen.

In the cross section shown in FIG. 2, the parts of the inner focusing electrode 10 and of the outer focusing electrode 17 are removed above the upper ends of the posts 4 and 5, to permit a top view of the holding means with the posts 4 and 5.

Figures 3, 4:
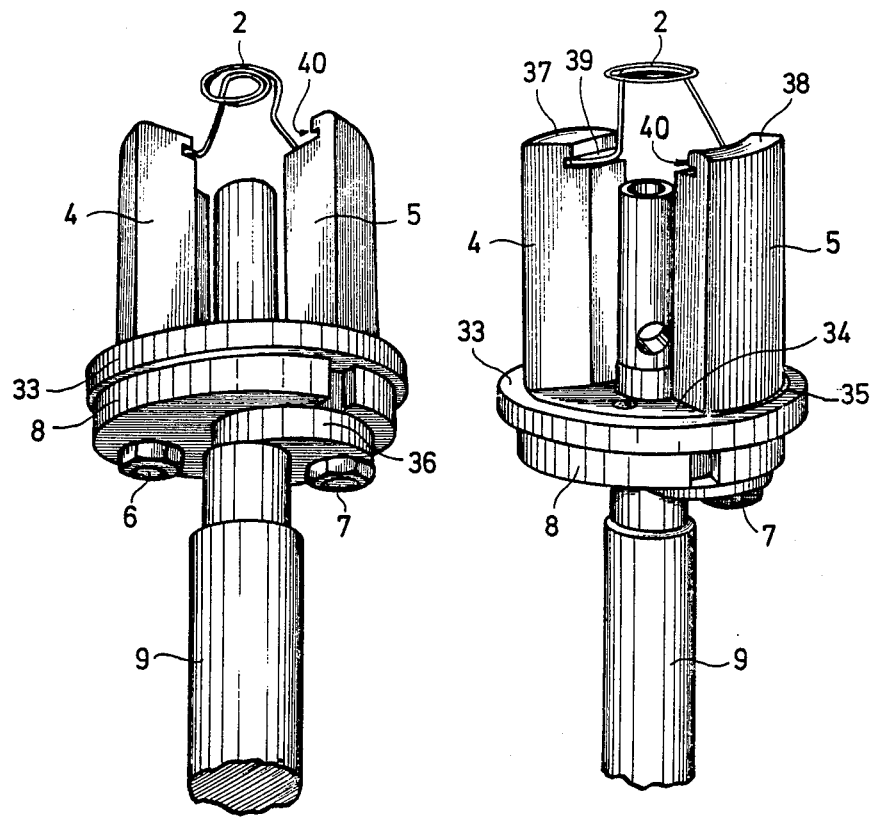
FIG. 3 is a perspective bottom view of the important parts of the filament holder.
FIG. 4 is a perspective general view of the subject of FIG. 3.

It can be seen from FIGS. 3 and 4 that the two posts are sector-shaped pieces taken from a hollow metal cylinder. The sectors are joined to the insulator 8 such that their inner and outer surfaces lie in the original cylinder surfaces. It is not necessary for the side surfaces of the sectors be precisely radial.

The posts have at their bottom end base plates 33 and 34 whose top and bottom faces lie in coplanar planes. Except for insulating gaps between them, the base plates together substantially make up a circular disk, and their axis coincides with the axis A—A. The base plate 33 joined to the post 4 is also in the form of a circular ring around the opposite post 5 leaving an insulating gap 35, as it can be seen especially in FIGS. 1 and 4. The assembly of the two base plates together with the posts is accomplished with the previously described terminal screws 6 and 7, which for this purpose are brought through the insulator 8 and are provided with nuts at their bottom ends. As it can be seen especially in FIG. 3, the supporting rod 9 is connected electrically to the terminal screw 7 by a radial lug 36. The terminal screws 6 and 7 are, as shown in FIG. 1, threaded into the support posts 4 and 5.

The support posts 4 and 5 have end faces 37 and 38 which lie in a common plane. Just below this plane there is provided a circumferential groove 39 and 40, respectively, whose bottom 41 is concentric with the axis A—A. The surfaces defining the grooves are (including the groove bottom 41) parts of common circular and cylindrical surfaces. The lower surfaces of the grooves are larger in each case, extending radially further inwardly than the upper defining surfaces, so that step-like configurations are formed at the inner edges of the posts 4 and 5.

In the bottom surfaces defining the grooves 39 and 40, cylindrical pins 42 and 43 are disposed at opposite points, parallel to the axis A—A, which are offset radially inwardly from the grooves, but leave between themselves and the groove bottom 41 distances of such a size that the mounting ends 44 and 45 of the cathode can be introduced behind the cylindrical pins 42 and 43 (FIGS. 1, 5 and 6) by a turning movement until the connecting limbs 46 and 47 stop against the cylindrical pins 42 and 43.

Figure 5:
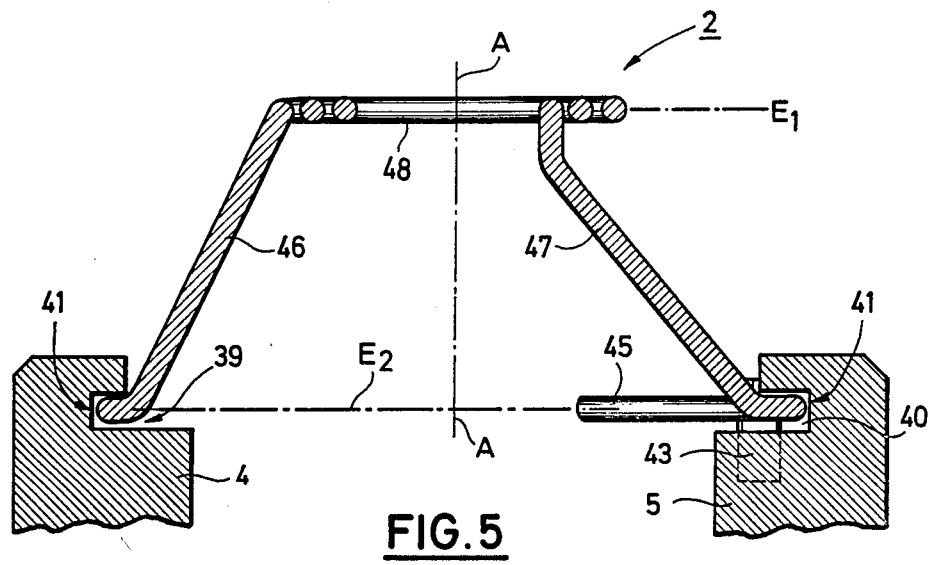
FIG. 5 is an axial cross section through the cathode and the upper end of the filament holder posts.
Figure 6:
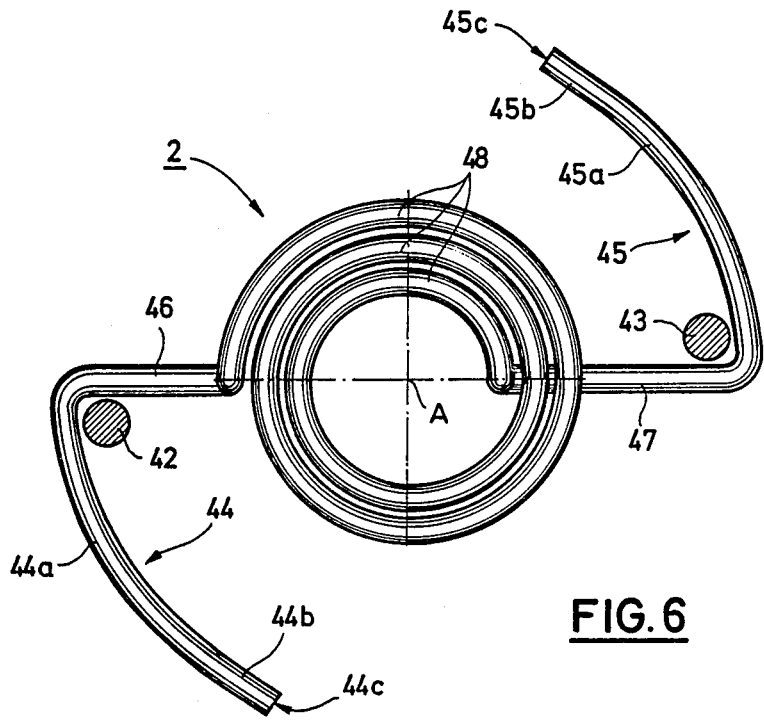
FIG. 6 is a top plan view of the subject of FIG. 5 with the filament holder posts omitted.

The shape of the cathode 2 is represented with particular clarity in FIGS. 5 and 6: the cathode 2 has a spirally wound portion 48 centered on the axis A—A. Portion 48 is the electron emitting portion which lies in a first radial plane E1. From portion 48 the connecting limbs 46 and 47 lead to the mounting ends 44 and 45. The latter in turn have portions 44a, 45a and 44b, 45b, respectively, of different radii of curvature, the radius of curvature of the sections 44a and 45a corresponding to the average radius of curvature of the groove bottom 41, while the radius of curvature of the adjoining portions 44b and 45b is clearly longer and preferably infinite, i.e., up to the ends 44c and 45c, the mounting ends 44 and 45 are rectilinear past the sections 44b and 45b. This results in better contact. The mounting ends 44 and 45 run with their central axes in a second radial plane E1 that is radial to the axis A—A. On the basis of their shape and resilient bias the mounting ends are held in a spring-biased and form-fitting manner in the circumferential grooves 39 and 40.

By turning it clockwise from the position shown in FIG. 6, the cathode 2 can easily be turned out of the circumferential grooves 39 and 40, and a new cathode can easily be installed by turning in the opposite direction until the connecting limbs 46 and 47 come against the cylindrical pins 42 and 43. The cathode is then perfectly centered in the bore 12 both axially (height) and radially, with good contact.

What is claimed is:

1. An electron gun comprising a cathode bent spirally from wire and a clamping means, said clamping means comprising a pair of supporting posts, said supporting posts shaped as sections of a hollow cylinder, an end of each post meeting an insulator, and a second end of said posts remote from said insulator meeting end, said remote ends having a circumferential groove adapted for reception of a mounting end of said cathode, each of said grooves defined by a portion of two common circular surfaces and one cylindrical surface, the mounting ends of said cathode configured complementary to said grooves and adapted for lying in said grooves in a spring biased and form-fitting manner.

2. Electron gun of claim 1, wherein the mounting ends of said cathode have a central radius of curvature which, from inside out, corresponds to a radius of curvature of said circumferential grooves, and which is enlarged toward end surfaces of said mounting ends.

3. Electron gun of claim 1, wherein said cathode comprises a spirally wound portion which lies in a first plane and the mounting ends of said cathode lie in a second plane, at least a portion of said mounting end lying on a common circumference, wherein said first and second planes are disposed radially to a common axis.

4. Electron gun of claim 1, wherein said circumferential grooves are disposed in a step-like configuration positioned at the ends of said supporting posts.

5. Electron gun of claim 4, further comprising a groove bottom in each of said circumferential grooves in front of each of which is positioned a cylindrical pin which is disposed radially inwardly with respect to said cathode, each pin positioned diametrically opposite the other and in front of one of said circumferential grooves.

6. Electron gun of each of said claim 1, wherein said supporting posts are disposed on a base plate so as to produce an insulating gap, said base plates being joined to an insulator, said plates and insulator forming a circular disk with an axis coincident with the axis of said cathode.

* * * * *